United States Patent
Hou et al.

(10) Patent No.: US 7,602,065 B2
(45) Date of Patent: Oct. 13, 2009

(54) SEAL RING IN SEMICONDUCTOR DEVICE

(75) Inventors: Shang-Yun Hou, Jubei (TW);
Chun-Hung Chen, Jhubei (TW);
Chia-Lun Tsai, Hsinchu (TW);
Pao-Kang Niu, Hsinchu (TW);
Shin-Puu Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 105 days.

(21) Appl. No.: 12/042,573

(22) Filed: Mar. 5, 2008

(65) Prior Publication Data

US 2009/0140391 A1 Jun. 4, 2009

Related U.S. Application Data

(60) Provisional application No. 60/991,325, filed on Nov. 30, 2007.

(51) Int. Cl.
*H01L 23/48* (2006.01)
*H01L 23/52* (2006.01)
*H01L 29/40* (2006.01)

(52) U.S. Cl. .............................. 257/758; 257/E23.002
(58) Field of Classification Search .................. 257/48, 257/620, 758, E21.522, E23.002
See application file for complete search history.

(56) References Cited

U.S. PATENT DOCUMENTS

| | | | | |
|---|---|---|---|---|
| 2004/0069227 A1* | 4/2004 | Ku et al. | ...................... | 118/721 |
| 2006/0267155 A1* | 11/2006 | Ohsumi | ...................... | 257/620 |
| 2009/0014867 A1* | 1/2009 | Krawiec | ...................... | 257/728 |

* cited by examiner

*Primary Examiner*—David S Blum
(74) *Attorney, Agent, or Firm*—Thomas, Kayden, Horstemeyer & Risley

(57) ABSTRACT

A semiconductor device includes a first circuit, a first seal ring and at least one first notch. The first seal ring surrounds the first circuit. The first notch cuts the first seal ring. Specifically, the first notch includes an inner opening, an outer opening and a connecting groove. The inner opening is located on the inner side of the first seal ring. The outer opening is located on the outer side of the first seal ring. The outer opening and the inner opening are not aligned. The connecting groove connects the inner opening and the outer opening.

17 Claims, 2 Drawing Sheets

SEAL RING IN SEMICONDUCTOR DEVICE

CROSS REFERENCE TO RELATED APPLICATIONS

This application claims the benefit of U.S. Provisional Application No. 60/991,325, filed Nov. 30, 2007.

BACKGROUND

1. Field of Invention

The present invention relates to an active solid-state device. More particularly, the present invention relates to multiple metal levels on a semiconductor, surrounded by insulating layers.

2. Description of Related Art

In electronics, an integrated circuit (IC) is a miniaturized electronic circuit (including semiconductor devices, as well as passive components) that has been manufactured in the surface of a thin substrate of semiconductor material. The first integrated circuit was developed in the 1950s by Jack Kilby of Texas Instruments and Robert Noyce of Fairchild Semiconductor. Hereafter, integrated circuits are used for a variety of devices due to their low cost and high performance.

In general, integrated circuits are fabricated simultaneously in multiples on a wafer. The wafer is sawed into individual chips once the fabrication is complete. Conventionally, the uppermost surfaces of the chips are generally protected by the deposition of a passivation layer. However, this passivation layer can not cover the periphery of each chip. Thus, the periphery of each chip is exposed to undesirable moisture and ionic contaminants. Accordingly, "seal rings," also known as "guard rings," generally are formed of at least one metal band around at least the upper periphery of each chip as part of the fabrication of the IC dice prior to sawing the wafer. These seal rings can provide structural reinforcement and stop undesirable moisture and mobile ionic contaminants from entering chip active circuitry regions and affecting operational reliability.

BRIEF SUMMARY OF THE INVENTION

One embodiment of the present invention provides a semiconductor device which includes a first circuit, a first seal ring and at least one first notch. The first seal ring surrounds the first circuit. The first notch cuts the first seal ring, and this first notch is Z shaped.

Another embodiment of the present invention provides a semiconductor device which includes a first circuit, a first seal ring and at least one first notch. The first seal ring surrounds the first circuit. The first notch cuts the first seal ring. Specifically, the first notch includes an inner opening, an outer opening and a connecting groove. The inner opening is located on the inner side of the first seal ring. The outer opening is located on the outer side of the first seal ring. The outer opening and the inner opening are not aligned. The connecting groove connects the inner opening and the outer opening.

Yet another embodiment of the present invention provides a semiconductor device which includes a substrate, a plurality of dielectric layers, a first circuit, a first seal ring and at least one first notch. The dielectric layers are formed on the substrate. The first seal ring surrounds the first circuit, and this first seal ring is embedded in the dielectric layers. The first notch cuts the first seal ring. Specifically, the first notch includes an inner opening, an outer opening and a connecting groove. The inner opening is located on the inner side of the first seal ring. The outer opening is located on the outer side of the first seal ring. The inner opening and the outer opening are located apart along the surrounding direction of the first seal ring. The connecting groove connects the inner opening and the outer opening.

BRIEF DESCRIPTION OF THE DRAWINGS

The present invention is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawings.

DETAILED DESCRIPTION

The structures of the present preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Traditionally, IC fabricator usually forms a slit cutting the seal ring to prevent current from being induced therein. However, this slit may provide a path for water, moisture or cracks to penetrate inside the seal ring. In order to solve this problem, the following embodiment will provide a Z shaped notch to elongate the distance of the penetration path, thereby blocking the penetration of water, moisture or cracks.

Figure 1:
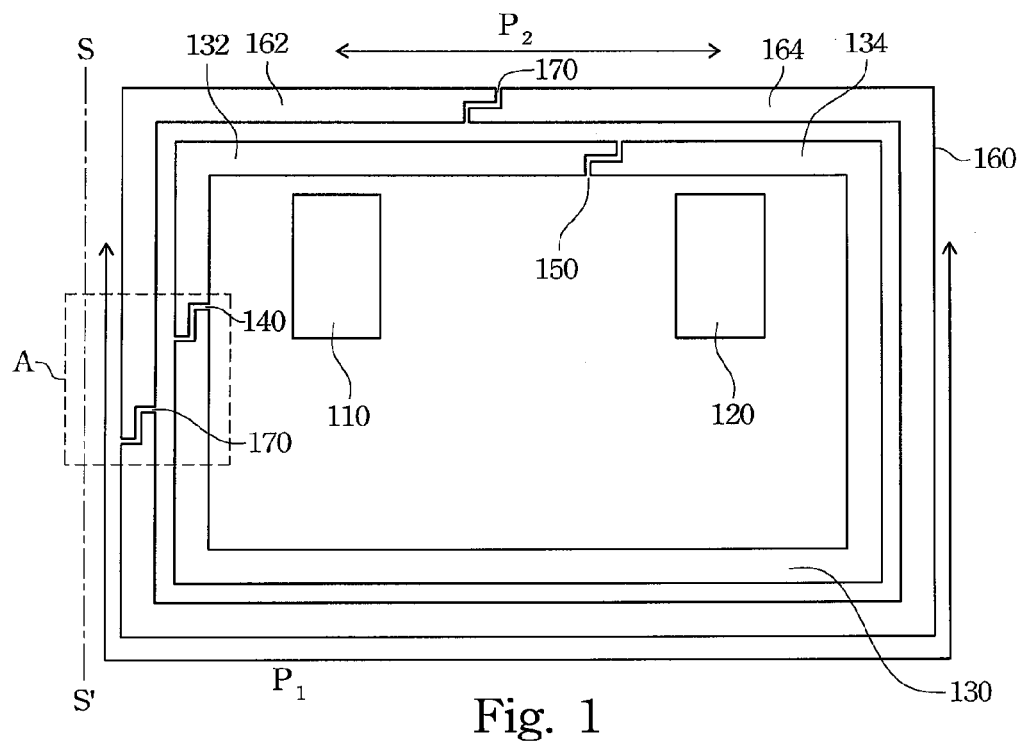
FIG. 1 illustrates a top view of an embodiment of the present invention.

Referring first to FIG. 1, in accordance with one aspect of the present invention, a semiconductor device includes a first circuit 110, a first seal ring 130 and at least one first notch 140. The first seal ring 130 surrounds the first circuit 110. The first notch 140 cuts the first seal ring 130, wherein the first notch 140 is Z shaped.

Figure 2:
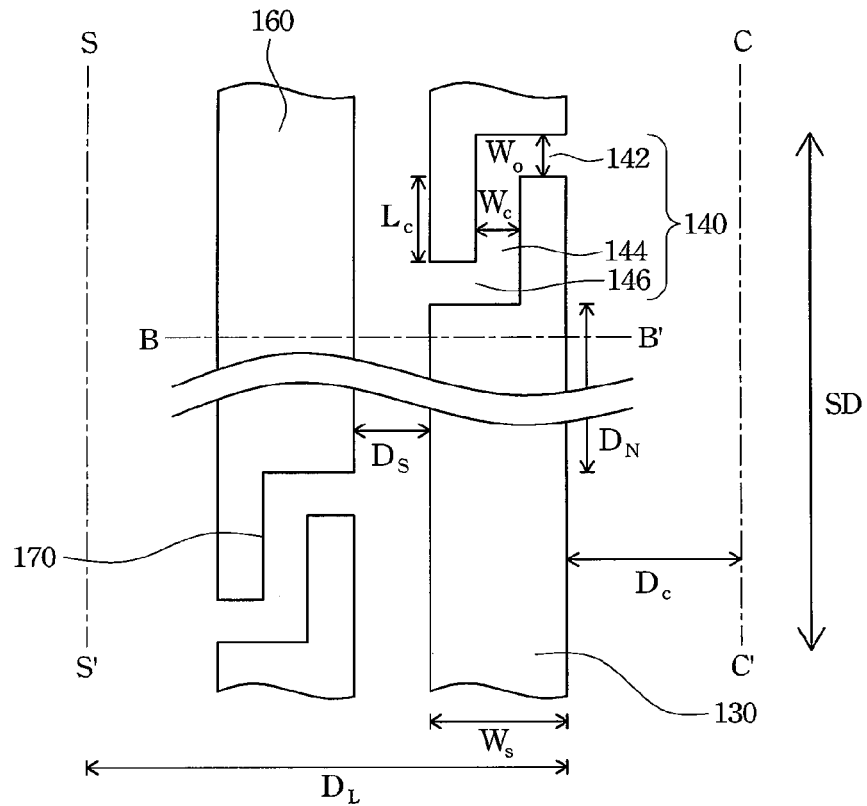
FIG. 2 illustrates an enlarged top view of part A of FIG. 1.

Referring to FIG. 2, which illustrates an enlarged top view of part A of FIG. 1, the first notch 140 may include an inner opening 142, an outer opening 146 and a connecting groove 144. The inner opening 142 is located on the inner side of the first seal ring 130. The outer opening 146 is located on the outer side of the first seal ring 130. The connecting groove 144 connects the inner opening 142 and the outer opening 146. In the present embodiment, the outer opening 146 and the inner opening 142 are not aligned. That is, the inner opening 142 and the outer opening 146 are located apart along the surrounding direction SD of the first seal ring 130.

The first notch 140 seems like a penetration path for water, moisture or cracks, but in fact this first notch 140 is long and tortuous enough to block the penetration of water, moisture or cracks. The size of the first notch 140 should depend on actual requirements. In the present embodiment, the width $W_O$ of the inner opening 142 may be about 2 μm. The width $W_C$ of connecting groove 144 may be about 1 μm, and the length $L_C$ of the connecting groove 144 may be between 4 μm and 12 μm.

Furthermore, the semiconductor device shown in FIG. 1 may further include a second circuit 120 and a second notch 150. The second circuit 120 is located apart from the first circuit 110 and surrounded by the first seal ring 130 as well.

In this configuration, undesirable current, i.e. noise, may be induced onto the first seal ring 130 to interfere with the operation of the first circuit 110 and/or the second circuit 120. Accordingly, the present embodiment may provide the second notch 150, which have substantially the same structure with the first notch 140. The first notch 140 and the second notch 150 cut the first seal ring 130 into a first portion 132 near the first circuit 110 and a second portion 134 near the second circuit 120. That is, the first notch 140 and the second notch 150 respectively cut off the paths $P_1$, $P_2$ from the first portion 132 to the second portion 134 through the first seal ring 130. As a result, there is no path for noise coupling from the first circuit 110 to the second circuit 120 or from the second circuit 120 to the first circuit 110 through the first seal ring 130.

Referring to FIG. 1, the semiconductor device may include a second seal ring 160 surrounding the first seal ring 130. Similarly, there may be at least one third notch 170 cutting the second seal ring 130, and this third notch 170 is not aligned with the first notch 140 and the second notch 150 to elongate the penetration path of water, moisture or cracks. The working arrangement of the third notch 170 should depend on actual requirements. In FIG. 2, the distance $D_N$ between the first notch 140 and the third notch 170 along the surrounding direction SD of the first seal ring 130 may be between 20 μm and 100 μm. In addition, the third notch 170 may have substantially the same structure with the first notch 140 and the second notch 150. That is, the third notch 170 may be Z shaped as well.

As shown in FIG. 1, the number of the third notch 170 may be plural, and the third notches 170 may cut the second seal ring 160 into a third portion 162 near the first circuit 110 and a fourth portion 164 near the second circuit 120. That is, the third notches 170 respectively cut off the path $P_1$, $P_2$ from the third portion 162 to the fourth portion 164 through the second seal ring 160. Therefore, there is no path for noise coupling from the first circuit 110 to the second circuit 120 or from the second circuit 120 to the first circuit 110 through the second seal ring 160 as well.

Referring to FIG. 2, the width $W_S$ of the first seal ring 130 may be about 4 μm, and the width of the second seal ring 160 may be about 4 μm as well. The distance $D_S$ between the first seal ring 130 and the second seal ring 160 may be about 2 μm. Furthermore, the distance $D_L$ between the inner side of the first seal ring 130 and a scribe line S-S', where the semiconductor device is separated from a wafer, may be about 11 μm, and the distance $D_C$ between the inner side of the first seal ring 130 and the edge C-C' of a circuit area, where the first circuit 110 (shown in FIG. 1) and the second circuit 120 (shown in FIG. 1) are located, may be about 9 μm.

Figure 3:
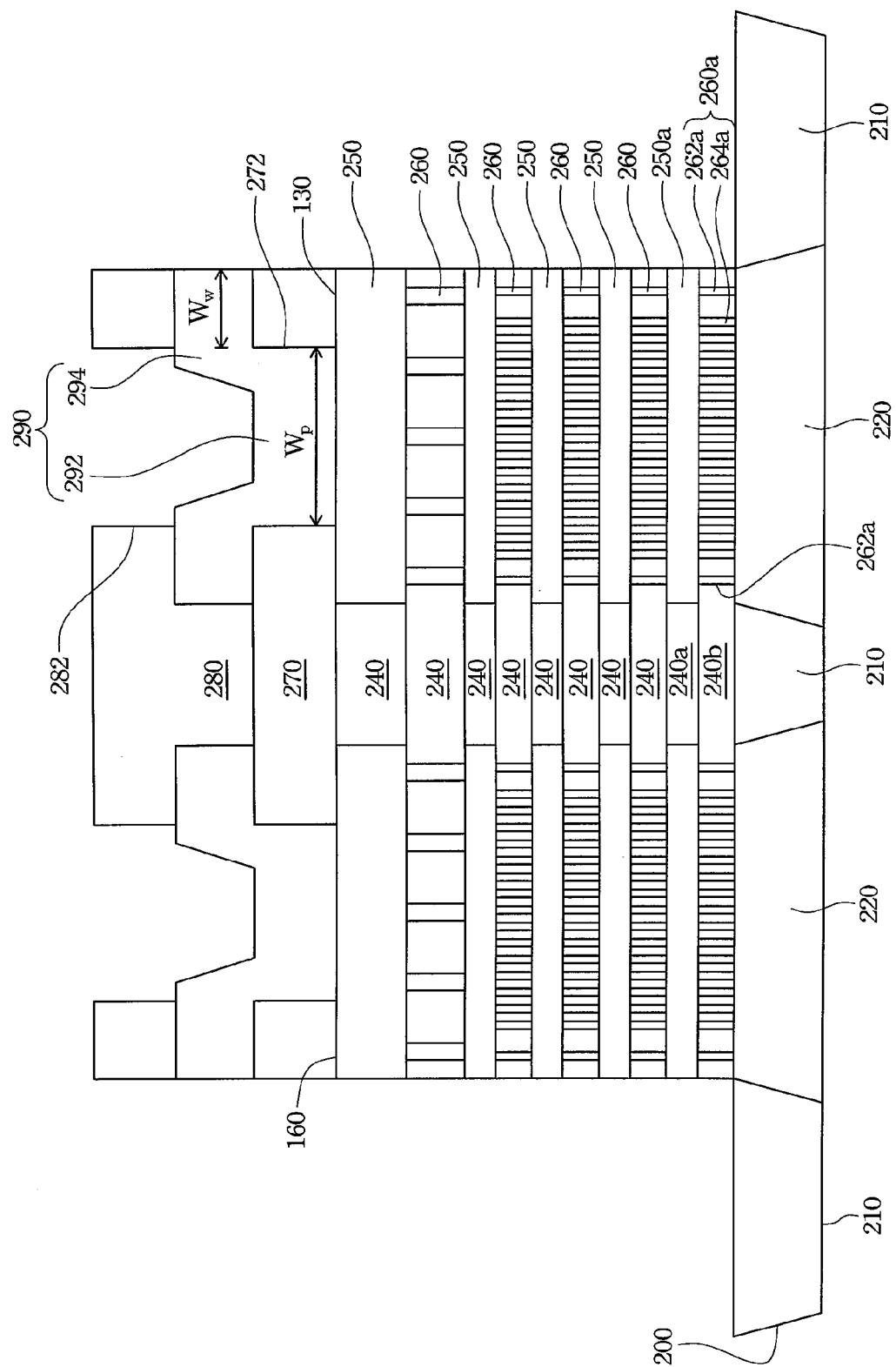
FIG. 3 illustrates a cross-sectional view of the line B-B' of FIG. 2.

Referring to FIG. 3, which illustrates a cross-sectional view of the line B-B' of FIG. 2, the semiconductor device may further have a substrate 200 and a plurality of dielectric layers 240 formed on the substrate 200. The first seal ring 130 is embedded in the dielectric layers 240. Particularly, the first seal ring 130 may extend through all of the dielectric layers 240. Furthermore, the second seal ring 160 may also be embedded in the dielectric layers 240.

As shown in FIG. 3, the first seal ring 130 may further comprise an active region 220, at least one metal layer 250 and at least one metal plug 260. The active region 220 is formed in the substrate 200, and two shallow trench isolations 210 may be located adjacent to the active region 220. The metal layers 250 shown in FIG. 3 are plural, and the metal layers 250 may be spaced from each other by one of the dielectric layers 240. Furthermore, the metal plugs 260 are also plural and positioned between the metal layers 250.

For example, the metal layer 250a is formed in the dielectric layer 240a separated from the active region 220 by the dielectric layer 240b. The metal plug 260a is positioned between the metal layer 250a and the active region 220.

The metal plug 260a may include two line contacts 262a located apart from each other and a plurality of square contacts 264a positioned between the line contacts 262a. The distance between the two line contacts 262a may be between 3 μm and 3.27 μm, and the distance between the square contacts 264a may be between 0.125 μm and 0.54 μm. Furthermore, the distance between the line contact 262a and the edge of the metal layer 250a may be between 0.14 μm and 0.275 μm. Moreover, the second seal ring 160 may have substantially the same structure and size with the first seal ring 130.

The first seal ring 130 and the second seal ring 160 as shown in FIG. 3 may be formed by a dual damascene process. The metal layer 250 and the metal plug 260 may be made of copper or tungsten. The dielectric constant of the dielectric layers 240 may be between 1 and 4.2. Particularly, the dielectric layers 240 may be made of fluorinated silicate glass, carbon doped oxide, fluorinate amorphous carbon, hydrogenated amorphous carbon, hydrogenated silsesquioxane, poly (arylene ethers), cyclotene, silicone oxide aerogel or silicone oxide xerogel. Furthermore, the dielectric layers 240 may be formed by spin coating or chemical vapor deposition.

As shown in FIG. 3, a first passivation layer 270 may cover the outermost metal layer 250 and the outermost dielectric layer 240. This first passivation layer 270 may have at least one hole 272 that exposes a part of the outermost metal layer 250. A metal pad 290 may be formed on the outermost metal layer 250. Specifically, this metal pad 290 may have a connecting part 292 filling the hole 272 of the first passivation layer 270 and two wing parts 294 located on the first passivation layer 270. The width $W_p$ of the connecting part 292 may be about 2 μm, and the width $W_w$ of each of the wing parts 294 may be between 1 μm and 2 μm. In addition, the metal pad 290 may be made of aluminum.

A second passivation layer 280 may cover the first passivation layer 270 and the metal pad 290. This second passivation layer 280 may have at least one hole 282 exposing a part of the metal pad 290.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a first circuit;
   a first seal ring surrounding the first circuit; and at least one first notch cutting the first seal ring, wherein the first notch is Z shaped.

2. The semiconductor device of claim 1, wherein the first notch comprises:
   an inner opening located on the inner side of the first seal ring;
   an outer opening located on the outer side of the first seal ring; and
   a connecting groove connecting the inner opening and the outer opening.

3. The semiconductor device of claim 1, further comprising a second circuit located apart from the first circuit and surrounded by the first seal ring, wherein a plurality of the first notches cut the first seal ring into a first portion near the first circuit and a second portion near the second circuit.

4. The semiconductor device of claim 1, further comprising a second seal ring surrounding the first seal ring.

5. The semiconductor device of claim 4, further comprising at least one second notch cutting the second seal ring, wherein the second notch and the first notch are not aligned.

6. The semiconductor device of claim 5, wherein the second notch is Z shaped.

7. A semiconductor device, comprising:
   a first circuit;
   a first seal ring surrounding the first circuit; and
   at least one first notch cutting the first seal ring, wherein the first notch comprises:
      an inner opening located on the inner side of the first seal ring;
      an outer opening located on the outer side of the first seal ring, wherein the outer opening and the inner opening are not aligned; and
      a connecting groove connecting the inner opening and the outer opening.

8. The semiconductor device of claim 7, further comprising a second circuit located apart from the first circuit and surrounded by the first seal ring, wherein a plurality of the first notches cut the first seal ring into a first portion near the first circuit and a second portion near the second circuit.

9. The semiconductor device of claim 7, further comprising a second seal ring surrounding the first seal ring.

10. The semiconductor device of claim 9, further comprising at least one second notch cutting the second seal ring, wherein the second notch and the first notch are not aligned.

11. A semiconductor device, comprising:
    a substrate;
    a plurality of dielectric layers formed on the substrate;
    a first circuit;
    a first seal ring surrounding the first circuit, wherein the first seal ring is embedded in the dielectric layers; and
    at least one first notch cutting the first seal ring, wherein the first notch comprises:
       an inner opening located on the inner side of the first seal ring;
       an outer opening located on the outer side of the first seal ring, wherein the inner opening and the outer opening are located apart along the surrounding direction of the first seal ring; and
       a connecting groove connecting the inner opening and the outer opening.

12. The semiconductor device of claim 11, further comprising a second circuit located apart from the first circuit and surrounded by the first seal ring, wherein a plurality of the first notches cut the first seal ring into a first portion near the first circuit and a second portion near the second circuit.

13. The semiconductor device of claim 11, further comprising a second seal ring surrounding the first seal ring, wherein the second seal ring is embedded in the dielectric layers.

14. The semiconductor device of claim 13, further comprising at least one second notch cutting the second seal ring, wherein the second notch and the first notch are not aligned.

15. The semiconductor device of claim 11, wherein the first seal ring comprises:
    an active region formed in the substrate;
    a metal layer formed in one of the dielectric layers separated from the active region by another one of the dielectric layers; and
    at least one metal plug positioned between the metal layer and the active region.

16. The semiconductor device of claim 15, wherein the metal plug has a plurality of line contacts located apart from each other.

17. The semiconductor device of claim 16, wherein the metal plug further has a plurality of square contacts positioned between the line contacts.

* * * * *